United States Patent
Manjunath (10) Patent No.: US 12,085,605 B1
(45) Date of Patent: Sep. 10, 2024

(54) SYSTEMS AND METHODS FOR ADJUSTING INPUT-OUTPUT IMPEDANCE FOR I/O INTERFACES

(71) Applicant: Meta Platforms Technologies, LLC, Menlo Park, CA (US)

(72) Inventor: Sri Harsha Manjunath, Folsom, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 16 days.

(21) Appl. No.: 18/173,510

(22) Filed: Feb. 23, 2023

(51) Int. Cl.
*G01R 31/28* (2006.01)

(52) U.S. Cl.
CPC .................. *G01R 31/2834* (2013.01)

(58) Field of Classification Search
None
See application file for complete search history.

(56) References Cited

U.S. PATENT DOCUMENTS

| | | | | |
|---|---|---|---|---|
| 8,816,773 | B2* | 8/2014 | Gerstenhaber | H03F 3/45085 330/252 |
| 9,710,007 | B2* | 7/2017 | Nee | H03G 1/0017 |
| 10,224,928 | B1* | 3/2019 | Mathur | G11C 11/40615 |
| 2004/0207451 | A1* | 10/2004 | Kitagawa | H03H 11/28 327/334 |
| 2005/0110608 | A1* | 5/2005 | Fukunaga | H01L 27/0802 257/E27.047 |
| 2006/0259256 | A1* | 11/2006 | Roach | G01R 19/0092 702/64 |
| 2007/0290704 | A1* | 12/2007 | Shyh | H01L 22/20 324/762.03 |
| 2008/0136381 | A1* | 6/2008 | Yang | G11C 5/147 365/189.09 |
| 2012/0262230 | A1* | 10/2012 | Llewellyn | H03F 3/187 330/124 R |
| 2016/0182044 | A1* | 6/2016 | Addepalli | G11C 16/06 326/30 |
| 2017/0288622 | A1* | 10/2017 | Tan | H03F 3/45179 |
| 2019/0311773 | A1* | 10/2019 | Jimenez-Olivares | G11C 5/147 |

OTHER PUBLICATIONS

Zhang et al., "An accurate current source with on-chip self-calibration circuits for low-voltage current-mode differential drivers," in IEEE Transactions on Circuits and Systems I: Regular Papers, vol. 53, No. 1, pp. 40-47, Jan. 2006 (Year: 2006).*

* cited by examiner

*Primary Examiner* — Daniel F. McMahon
(74) *Attorney, Agent, or Firm* — Foley & Lardner LLP (57) ABSTRACT

In one embodiment, a method includes generating, through a first transistor of an impedance trimming circuit, a precision current based on a reference voltage and an automatic test equipment (ATE) in a first phase of the impedance trimming circuit, wherein the ATE is coupled to the impedance trimming circuit to receive the precision current; mirroring the precision current into a second transistor and a first on-die resistor; sending a first internal voltage feedback at an internal node VFBINT to the ATE, wherein the internal node VFBINT is coupled to the second transistor and the first on-die resistor; and receiving a first trimming code to trim the first on-die resistor, wherein the first trimming code is based on a comparison of the first on-die resistor and a target on-die resistor by the ATE.

20 Claims, 6 Drawing Sheets

SYSTEMS AND METHODS FOR ADJUSTING INPUT-OUTPUT IMPEDANCE FOR I/O INTERFACES

TECHNICAL FIELD

This disclosure generally relates to impedance trimming techniques, and in particular relates to high-speed input/output (I/O) interface input output impedance trimming.

BACKGROUND

High-speed input/output (I/O) interfaces are communication links used in semiconductors to transfer large amount of data at high speed between different components or devices. High-speed I/O interfaces have become essential for modern electronics as the demand for faster data transfer and processing has increased. High-speed I/O interfaces are used in various applications, including computer systems, data centers, consumer electronics, and mobile devices for fast data transfer between components such as storage drivers, graphics cards, and central processing units (CPUs). Impedance trimming is a critical aspect of high-speed I/O interfaces, as the accuracy of the impedance matching may significantly impact the signal integrity of the high-speed I/O interfaces. For high-speed I/O interfaces, impedance mismatching may cause signal integrity issues such as reflections, crosstalk, and increased bit errors, which may lead to reduced signal quality and reduced data transfer rates. Impedance trimming for high-speed I/O interfaces can be performed during the manufacturing design and manufacturing stages of electronics system, may include adjusting the impedance of the interface components in a printed circuit board (PCB) to ensure the components meet the impedance specification, which improves the overall performance of the interface.

SUMMARY OF PARTICULAR EMBODIMENTS

In particular embodiments, a high-speed input/output (I/O) interface impedance trimming circuit may be configured to calibrate input and output impedance mismatch between a transmitter (TX) and a receiver (RX) with the transmission channel. The impedance trimming circuit may comprise on-die resistor that may be trimmed at the configuration phase to meet the specification. Once the on-die resistor is trimmed, the impedance trimming circuit may be further configured to calibrate the TX and RX termination resistors at the production phase in response to a plurality of variations (e.g., process variation, temperature variation, and voltage variation).

In particular embodiments, a high-speed input/output (I/O) interface impedance trimming circuit may generate, through a first transistor of an impedance trimming circuit, a precision current based on a reference voltage and an automatic test equipment (ATE) in a first phase of the impedance trimming circuit. The first phase may be the configuration phase. The ATE may be coupled to the impedance trimming circuit to receive the precision current. The impedance trimming circuit may then mirror the precision current into a second transistor and a first on-die resistor. The impedance trimming circuit may send a first internal voltage feedback at an internal node VFBINT to the ATE. The internal node VFBINT may be coupled to the second transistor and the first on-die resistor. The impedance trimming circuit may then receive a first trimming code to trim the first on-die resistor, wherein the first trimming code is based on a comparison of the first on-die resistor and a target on-die resistor by the ATE.

In particular embodiments, the impedance trimming circuit may comprise a first switch and a second switch. The first switch and the second switch may control the impedance trimming circuit switching between the first phase and a second phase. The second phase may be a production phase. At the production phase, the impedance trimming circuit may generate, through the second transistor of the impedance trimming circuit, a reference current based on the trimmed first on-die resistor and the reference voltage. The impedance trimming circuit may mirror the reference current into a third transistor and a second on-die resistor and then a second internal voltage feedback at an internal node VINT to a logic block of the impedance trimming circuit. The internal node VINT may be coupled to the third transistor and ground. The impedance trimming circuit may then determine a second trimming code to trim the second on-die resistor, wherein the second trimming code is based on a comparison of the second on-die resistor and the target on-die resistor.

In particular embodiments, the ATE may comprise a circuit that is configured to mimic an external precision resistor (REXT). In particular embodiments, the mirrored precision current may be generated by a 1:1 current mirror through the second transistor. In particular embodiments, the first trimming code is stored in a shadow register of the impedance trimming circuit. The first trimming code may be loaded to the shadow register of the impedance trimming circuit when the impedance trimming current is powered on. In particular embodiments, the impedance trimming circuit may communicate with the ATE through a communication channel (e.g., joint test action group (JTAG)). In particular embodiments, the impedance trimming circuit may comprise an electrostatic discharge (ESD) circuit to improve the accuracy of the first internal voltage feedback. The ESD may be coupled to the switch and a pad at the first phase (e.g., configuration phase) of the impedance trimming circuit.

Certain technical challenges exist for performing a precision impedance trimming of the high-speed I/O interface without an external component. One technical challenge may include there may be limited space on the PCB to place the precise external resistor REXT for impedance trimming of the on-die resistor. The solution presented by the embodiments disclosed herein to address this challenge may be connecting the on-die resistor to the ATE and trim the on-die resistor based on a precision current synced to ATE and a voltage value over the on-die resistor. Another technical challenge may include there may be limited space on the PCB to place the precise external resistor REXT for impedance trimming of the driver resistance. The solution presented by the embodiments disclosed herein to address this challenge may be having switchable feedback loops that are enabled at different stages for impedance trimming.

Certain embodiments disclosed herein may provide one or more technical advantages. A technical advantage of the embodiments may include saving space and lowering the PCB cost. Certain embodiments disclosed herein may provide none, some, or all of the above technical advantages. One or more other technical advantages may be readily apparent to one skilled in the art in view of the figures, descriptions, and claims of the present disclosure.

The embodiments disclosed herein are only examples, and the scope of this disclosure is not limited to them. Particular embodiments may include all, some, or none of the components, elements, features, functions, operations, or steps of the embodiments disclosed herein. Embodiments according to the invention are in particular disclosed in the attached claims directed to a method, a storage medium, a system and a computer program product, wherein any feature mentioned in one claim category, e.g., method, can be claimed in another claim category, e.g., system, as well. The dependencies or references back in the attached claims are chosen for formal reasons only. However, any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

DESCRIPTION OF EXAMPLE EMBODIMENTS

Figure 1:
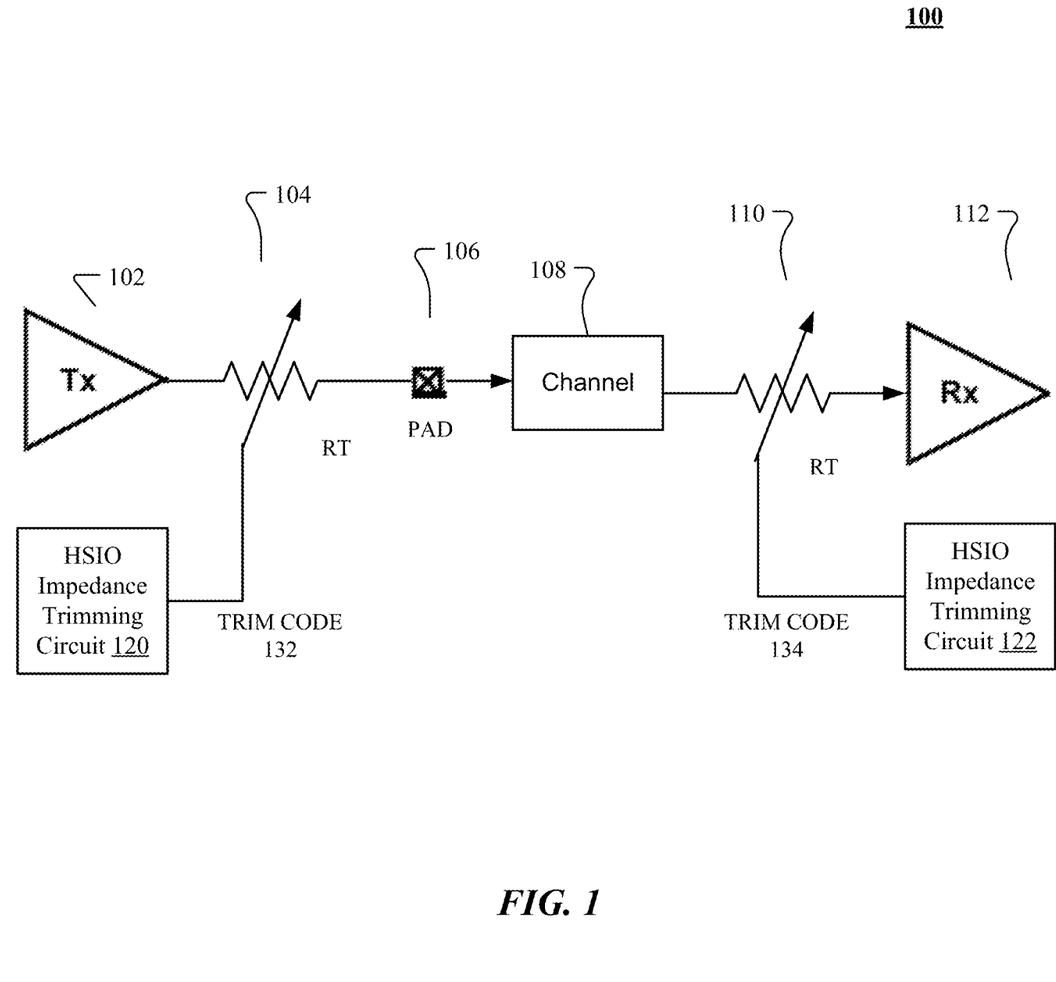
FIG. 1 illustrates an example high-speed I/O Interface input output impedance trimming system.

FIG. 1 illustrates an example high-speed I/O Interface input output impedance trimming system. The high speed I/O interface system 100 may comprise a transmitter (TX) 102, and an input output impedance RT 104 associated with the transmitter 102, The impedance RT may be a variable that is connected to a pad 106. The pad 106 may drive a transmission channel 108. The high-speed I/O interface system 100 may comprise a receiver end that comprises a termination impedance RT 110 and a receiver (RX) 112. The termination resistances RT 106 and 108 may match the characteristic impedance of the transmission channel 108. The termination resistance RT 106 and RT 110 may be variable (e.g., ±50%) on-die resistors due to various variations such as process, voltage, and temperature (PVT) variations. The resistor variations without calibrating RT may affect the signal integrity that is received at the receiver RX 112 and may cause the signal data to have errors. The high-speed I/O interface system 100 may comprise I/O calibration logic that may monitor the on-die variations (PVT variations) for both TX and RX and may then trim RT according to the monitored variations. In particular embodiments, the high-speed I/O interface system 100 may comprise a high-speed I/O impedance trimming circuit 120 for the TX 102 and a high-speed I/O impedance trimming circuit 122 for the RX 112 for impedance trimming. In particular embodiments, a high-speed input/output (I/O) interface impedance trimming circuit 120 may be configured to calibrate the input and output impedance mismatch between the TX 102 and RX 112 with the transmission channel 108. The impedance trimming circuit 120 may comprise on-die resistor that may be trimmed at the configuration phase to meet the specification. Once the on-die resistor is trimmed, the impedance trimming circuit 120 may be further configured to calibrate the TX and RX termination resistors 104 and 110 at the production phase in response to a plurality of variations (e.g., process variation, temperature variation, and voltage variation). The impedance trimming circuit 120 may provide trim code 132 to a plurality of TX slices. Similarly, trim code 134 may be provided to trim termination resistance of a plurality of RX slices.

In semiconductor applications, a high-speed interface may be used for communications between dies and chips. As an example not by way of limitation, for die-to-die communication, two dies may sit on top of each other on a substrate and high-speed interfaces may be added to edges of the two dies for the two dies to communicate. Additionally or alternatively, one of the two dies that sit on top of the each other may communicate to another chip on the same substrate. The high-speed interfaces may communicate with the external world based on requirements (e.g., 100 100 Mbps). In order to meet the communication requirements and overcome the impedance variations, one approach may be implemented with generating a precision current out of a band gap reference voltage provided to an amplifier by having a loop through a transistor device external resistor REXT. The external resistor REXT may be an on-board resister that has a low resistor tolerance (e.g., 0.1%). The precision current may be mirrored to another transistor device and an on-die resistor that in coupled to an internal ground. While the mirrored precision current drops on the on-die resistor, a voltage that tracks impedance variation of the on-die resistor may be obtained and digitized. The voltage may be used for impedance trimming to TX and RX. However, in some semiconductor applications, the space on a printed circuit board (PCB) is precious, and there may be limited space in PCB to place the external resistor REXT outside the die. In particular embodiments, the high speed I/O interface system 100 may trim high-speed I/O Interface input output impedance with an impedance trimming circuit that may be switchable between a configuration phase and a production phase, and an automatic test equipment (ATE) coupled to the impedance trimming circuit.

Figure 2:
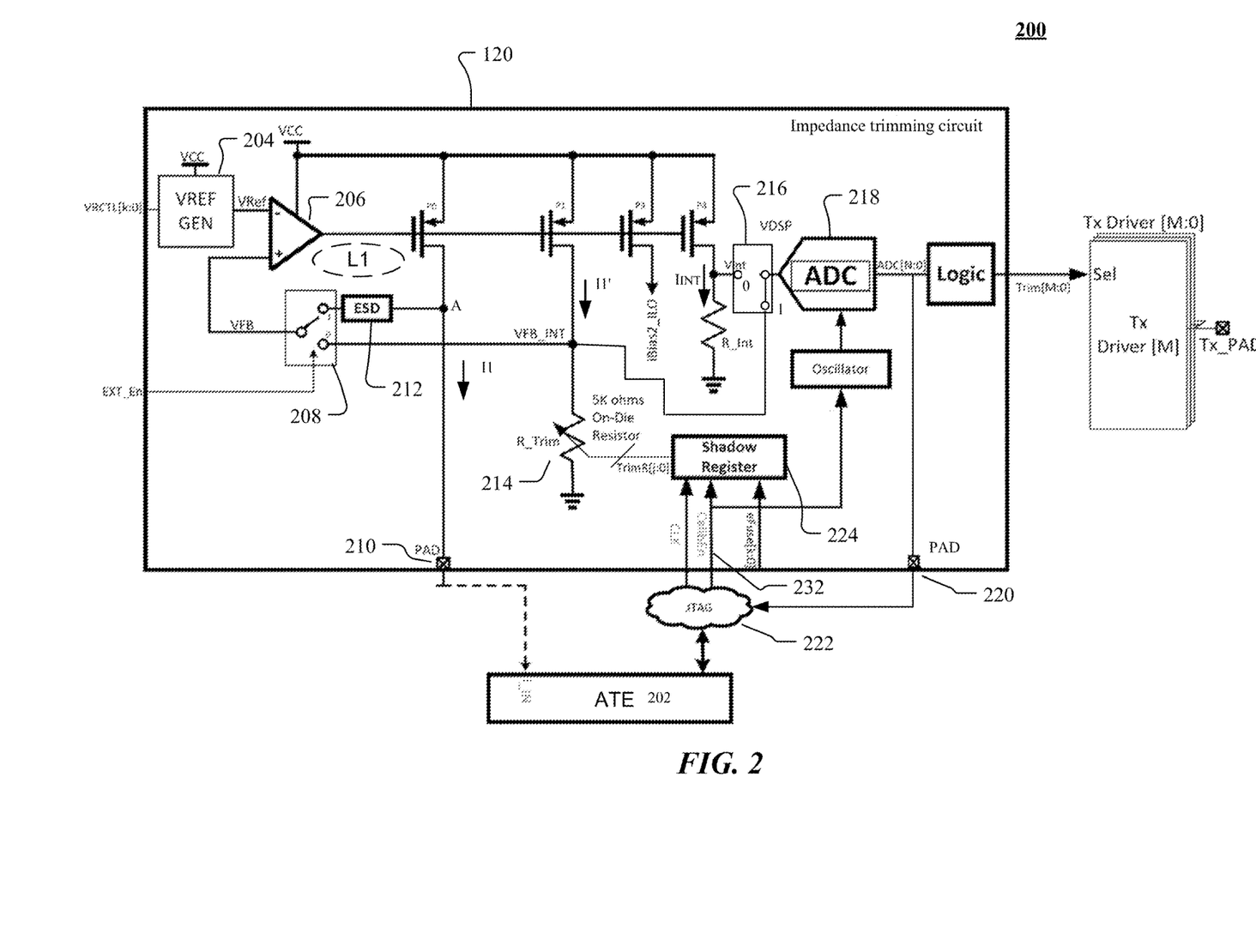
FIG. 2 illustrates an example diagram of a high-speed I/O impedance trimming circuit at a configuration phase.

FIG. 2 illustrates an example diagram of a high-speed I/O impedance trimming circuit at a configuration phase. In particular embodiments, the high-speed I/O interface system 100 may comprise a high-speed input/output (I/O) interface impedance trimming circuit 120 and an automatic test equipment (ATE) 202 coupled to the impedance trimming circuit 120. The impedance trimming circuit 120 may generate a precision current I1 out of a reference voltage VRef that is provided by a reference voltage generator 204 to an amplifier 206 by having a first feedback loop L1 through a first transistor device P0 at a configuration phase of the impedance trimming circuit 120. The configuration phase is enabled by selectively connecting a first switch 208 to a node A that is between the first transistor P0 and a first pad 210 that connects external worlds. The first switch 208 may be coupled to a positive input of the amplifier 206. The impedance trimming circuit 120 may directly sink the precision current I1 to the ATE 202 by connecting the first transistor device P0 to the first pad 210 that connects external worlds and then connecting the first pad 210 to the ATE 202. The ATE 202 may comprise a circuit that is configured to mimic the process of dropping the precision current on the external precision resistor REXT.

In particular embodiments, an electrical discharge (ESD) component 212 may be coupled to the first switch 208 and the node A in the first feedback loop L1 to protect the first transistor device P0 and the amplifier 204. There may be device damage when exposing circuit pins due to electrostatic discharge. There may not be a current drop on the ESD 212 in the first feedback loop L0, so the amplifier 206 may receive a precise voltage feedback VFB.

In particular embodiments, the impedance trimming circuit 120 may comprise a second transistor device P1 that is coupled to the amplifier 206 in parallel with the first transistor device to mirror the precision current I1. A mirrored precision current I1' may be dropped on the second transistor P1 and a first on-die resistor 214. In particular embodiments, the mirrored precision current may have a gain of 1, such that the I1 and I1' are identical or very close to each other when a mismatch between the first and second transistor device is minimal. Additionally or alternatively, the mirrored precision current may be scalable with other gain values. In particular embodiments, due to semiconductor process variations, the first on-die resistor 214 may be programmable for trimming during impedance calibration. As an example not by way of limitations, the first on-die resistor 214 may be a binary-coded resistor load with a plurality of parallel connected resistors that may be rimmed based on a binary code TrimR[j:0]. The first on-die resistor may be coupled to an internal ground.

In particular embodiments, the voltages at a VFB_INT node between the first on-die resistor 214 and second transistor P1 may be provided to an analog-to-digital converter (ADC) 218. The ADC 218 may be connected selectively to the VFB_INT node at the production phase of the impedance trimming circuit 120 through the second switch 216 that is coupled to an input of the ADC 218. The ADC 218 may be coupled to a second pad 220 to provide a digitized reference voltage at the VFB_INT node to the ATE 202 through a communication channel 222. The communication channel may be a joint test action group (JTAG). The JTAG may be on-die. In particular embodiments, the ATE 202 may be coupled to a shadow register 224 of the impedance trimming circuit 120 through the communication channel 222. The shadow register 224 may receive a trimming instruction (e.g., a trimming code) for trimming the first on-die resistor 214 to meet an on-die target resistor specification.

In particular embodiments, the impedance trimming circuit 120 may generate, through the first transistor P0 of an impedance trimming circuit 120, the precision current I1 based on a reference voltage VRef and the ATE 202 in a first phase of the impedance trimming circuit 120. The ATE 202 is coupled to the impedance trimming circuit 120 to receive the precision current I1. The first phase may be the configuration phase that is enabled by selectively connecting the first switch 208 that is coupled to the positive input of the amplifier 206 to the node A and by selectively connecting the second switch 216 that is coupled to the input of the ADC 218 to the VFB_INT node (e.g., phase "1"). As an example not by way of limitation, the precision current may be I1=100 μA and a target on-die resistor to be R_Trim=5k ohms. The impedance trimming circuit 120 may mirror the precision current I1=100 μA into the second transistor and the first on-die resistor 214. The mirrored precision current I1'=I1=100 μA. The first on-die resistor may be R_Trim=7k ohms due to PVT variations, and the feedback voltage at the VFB_INT node may be read as VFB_INT=I1'×R_Trim≈0.7V (I1'≈I1). The impedance trimming circuit 120 may send the first internal voltage feedback VFB_INT=0.7V at an internal node VFB_INT to the ATE 202 through the ADC 218 and the communication channel 222. At ATE 222, the ATE 22 may obtain the first internal voltage feedback value associated with the on-die resister 214 and the precision current I1 that is received through the first pad 210. The ATE 222 may compare the on-die resistor value R_Trim based on R_Trim=VFB_INT/I1=7k ohms to the target on-die resistor to be R_Trim=5k ohms. The impedance trimming circuit 120 may receive a first trimming code TrimR [j:0] to trim the first on-die resistor 214 based on a comparison of the first on-die resistor and a target on-die resistor by the ATE 202. As an example not by way of limitation, the on-die resistor R_Trim=7k ohms may be trimmed with a decrease of 2k ohms at one time to meet the specification. Additionally or alternatively, the on-die resistor R_Trim=7k ohms may be trimmed multiple times until the specification R_Trim=5k ohms is satisfied while the ATE 202 keeps monitoring the first internal voltage feedback change at the VFB_INT node. Additionally or alternatively, the trimmed on-die resistor may be with an error tolerance (e.g., 0.1%) that is predetermined.

In particular embodiments, the impedance trimming circuit 120 may receive an enabling signal 232 that indicates the on-die resistor trimming is completed when the target on-die resistor is satisfied (e.g., the on-die resistor is trimmed to 5k ohms) through the communication channel 222. The ADC 218 may receive the enabling signal 232 to the ADC 218. In particular embodiments, the communication channel may send a clock signal to the shadow register 224. The impedance trimming circuit 120 may store the first trimming code in the shadow register 224. The first trimming code may be loaded to the shadow register 224 when the impedance trimming circuit 120 is powered up. Although this disclosure describes trimming the first on-die resistor at a configuration phase in a particular manner, this disclosure contemplates trimming the first on-die resistor at a configuration phase in any suitable manner.

Figure 3:
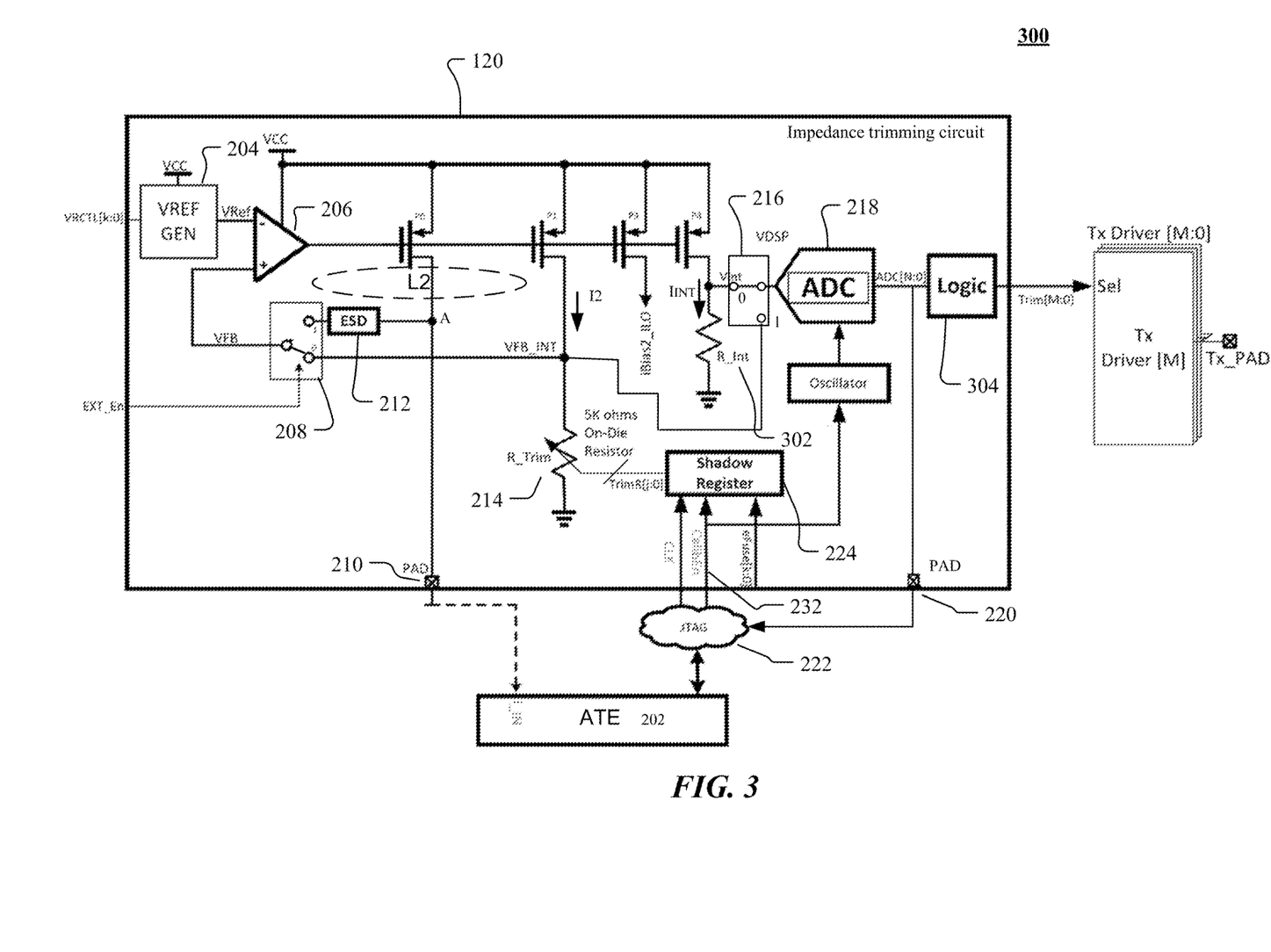
FIG. 3 illustrates an example diagram of a high-speed I/O impedance trimming circuit at a production phase.

FIG. 3 illustrates an example diagram of a high-speed I/O impedance trimming circuit at a production phase. The first switch 208 coupled to a positive input of the amplifier 206 may be selectively connected to the VFB_INT node to switch the impedance trimming circuit 120 from a configuration phase to a production phase. The gain of the amplifier 204 may be high so that the reference voltage VRef may be applied to the VFB_INT node. The impedance trimming circuit 120 may generate a reference current I2 out of a reference voltage VRef that is provided by the reference voltage generator 204 to an amplifier 206 by having a second feedback loop L2 through the second transistor device P1 at a production phase of the impedance trimming circuit 120.

In particular embodiments, the impedance trimming circuit 120 may comprise a third transistor device P4 that is coupled to the amplifier 206 in cascades manner with the first and second transistor P0 and P1 to mirror the reference current I2. A mirrored precision current Iint may be dropped on the third transistor P4 and a second on-die resistor R_int 302. In particular embodiments, the mirrored reference current may have a gain of 1, such that the Iint and I2 are identical or very close to each other when a mismatch between the first and second transistor device is minimal. Additionally or alternatively, the mirrored reference current may be scalable with other gain values. In particular embodiments, the second on-die resistor 302 may be programmable for trimming during impedance calibration due to semiconductor process variations. The second on-die resistor may be coupled to an internal ground.

In particular embodiments, the voltages at a Vint node between the third transistor P4 and the second on-die resistor 302 and second transistor P1 may be provided to an analog-to-digital converter (ADC) 218. The ADC 218 may be connected selectively to the Vint node at the production phase of the impedance trimming circuit 120 through the second switch 216 that is coupled to an input of the ADC 218. The ADC 218 may be coupled to the second pad 220 to provide a digitized reference voltage at the Vint node to a logic block 304.

In particular embodiments, the second on-die resistor 302 may correspond to a driver. Additionally or alternatively, the second on-die resistor 302 may be a termination resistor in a driver. The total resistance R_int associated with the second on-resistor 302 may be the termination resistance RT plus the device resistance RM. As an example not by way of limitation, for a NMOS driver, the resistance R_int to be trimmed of second on-die resistor 302 is equal to the resistor resistance RT and the NMOS device resistance RM.

In particular embodiments, the impedance trimming circuit 120 may generate, through the second transistor P1 of an impedance trimming circuit 120, the reference current I2 based on the trimmed first on-die resistor 214 and the reference voltage VRef in a second phase of the impedance trimming circuit 120. The second phase may be the production phase that is enabled by selectively connecting the first switch 208 that is coupled to the positive input of the amplifier 206 to the VFB_INT node and by selectively connecting the second switch 216 that is coupled to the input of the ADC 218 to the Vint node (e.g., phase "0"). As an example not by way of limitation, the trimmed on-die resistor 214 may be around 5k ohms, so that the impedance trimming circuit 120 may generate the reference current I2≈100 mA based on the reference voltage and 5k ohms on-die resistor 214. The mirrored reference current Iint≈I2≈100 mA.

The first on-die resistor may be R_Trim=8k ohms due to PVT variations, and the feedback voltage at the Vint node may be read as Vint=Iint×R_int≈0.8V (Iint≈I2). The impedance trimming circuit 120 may send the second internal voltage feedback Vint=0.8V at an internal node Vint to the logic block 304 through the ADC 218. The logic block 304 may determine a second trimming code Trim [M:0] to trim the second on-die resistor R_int for the Tx driver based on a comparison of the second on-die resistor R_int=Vint/Iint=8k ohms and the target on-die resistor 5k ohms. As an example not by way of limitation, the second on-die resistor R_int=8k ohms may be trimmed with a decrease of 3k ohms at one time to meet the characteristic impedance. Additionally or alternatively, the second on-die resistor R_int=8k ohms may be trimmed multiple times until the impedance characteristic of 5k ohms is satisfied while the logic block 304 keeps monitoring the first internal voltage feedback change at the node Vint. Additionally or alternatively, the trimmed on-die resistor may be with a tolerance (e.g., 5K ohms+20%) that is predetermined. In particular embodiments, the logic block 304 of the impedance trimming circuit 120 may send the second trimming code to a plurality of TX drivers (e.g., M TX drivers). Although this disclosure describes trimming the TX driver resistor at a production phase in a particular manner, this disclosure contemplates trimming the TX driver at a production phase in any suitable manner.

In particular embodiments, the impedance trimming circuit 120 may receive signals indicating a connection of the first switch and the second switch respectively. As an example not by way of limitation, at the time that impedance trimming circuit 120 is connected to the ATE 202 at the configuration phase, the first switch may receive a signal from the ATE 202 that indicates the first switch to connect to the A node (phase "1" of the first switch) and the second switch to connect to the VFB_INT node (phase "1" of the second switch). Similarly, at the time that impedance trimming circuit 120 is used for TX deriver trimming, the second switch may connect to the VFB_INT node (phase "0" of the first switch) and the second switch to connect to the Vint node (phase "0" of the second switch).

In particular embodiment, the impedance trimming circuit 120 may be connected to an external precision resistor REXT when there is availabilities of pads on die. Additionally or alternatively, when there's limited pad availability and without the external precision resistor REXT, the impedance trimming circuit 120 may be trimmed with ATE and store a trimming code in the shadow register.

In particular embodiments, the impedance trimming circuit 120 may comprise a fourth transistor that cascades with the first, second and third transistor.

Figure 4:
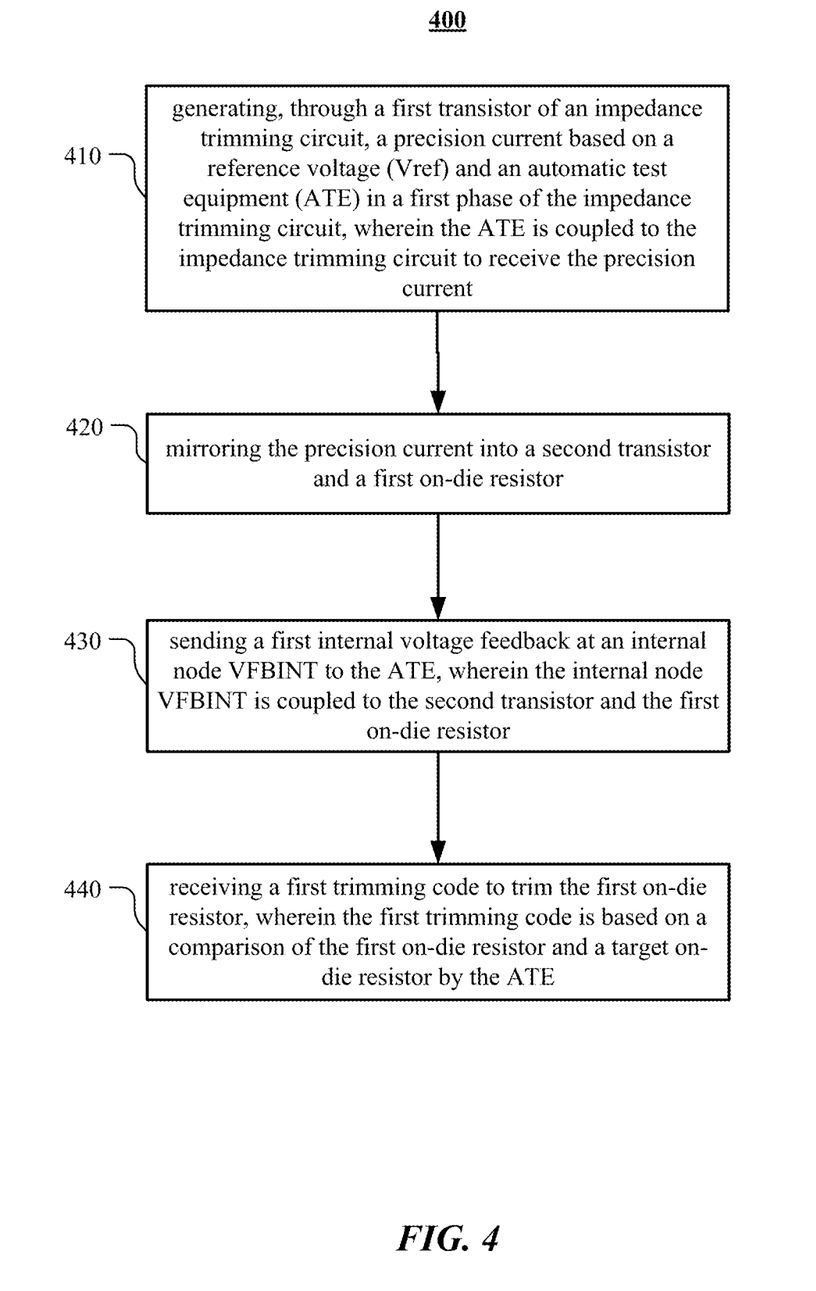
FIG. 4 illustrates an example method for on-die resistor impedance trimming at a configuration phase.

FIG. 4 illustrates an example method 400 for on-die resistor impedance trimming at a configuration phase. The method may begin at step 410, where the high-speed I/O impedance trimming circuit 120 may generate, through a first transistor of an impedance trimming circuit, a precision current based on a reference voltage and an automatic test equipment (ATE) in a first phase of the impedance trimming circuit, wherein the ATE is coupled to the impedance trimming circuit to receive the precision current. At step 420, the high-speed I/O impedance trimming circuit 120 may mirror the precision current into a second transistor and a first on-die resistor. At step 430, the high-speed I/O impedance trimming circuit 120 may send a first internal voltage feedback at an internal node VFBINT to the ATE, wherein the internal node VFBINT is coupled to the second transistor and the first on-die resistor. At step 440, the high-speed I/O impedance trimming circuit 120 may receive a first trimming code to trim the first on-die resistor, wherein the first trimming code is based on a comparison of the first on-die resistor and a target on-die resistor by the ATE. Particular embodiments may repeat one or more steps of the method of FIG. 4, where appropriate. Although this disclosure describes and illustrates particular steps of the method of FIG. 4 as occurring in a particular order, this disclosure contemplates any suitable steps of the method of FIG. 4 occurring in any suitable order. Moreover, although this disclosure describes and illustrates an example method for on-die resistor impedance trimming at a configuration phase including the particular steps of the method of FIG. 4, this disclosure contemplates any suitable method for on-die resistor impedance trimming at a configuration phase including any suitable steps, which may include all, some, or none of the steps of the method of FIG. 4, where appropriate. Furthermore, although this disclosure describes and illustrates particular components, devices, or systems carrying out particular steps of the method of FIG. 4, this disclosure contemplates any suitable combination of any suitable components, devices, or systems carrying out any suitable steps of the method of FIG. 4.

Figure 5:
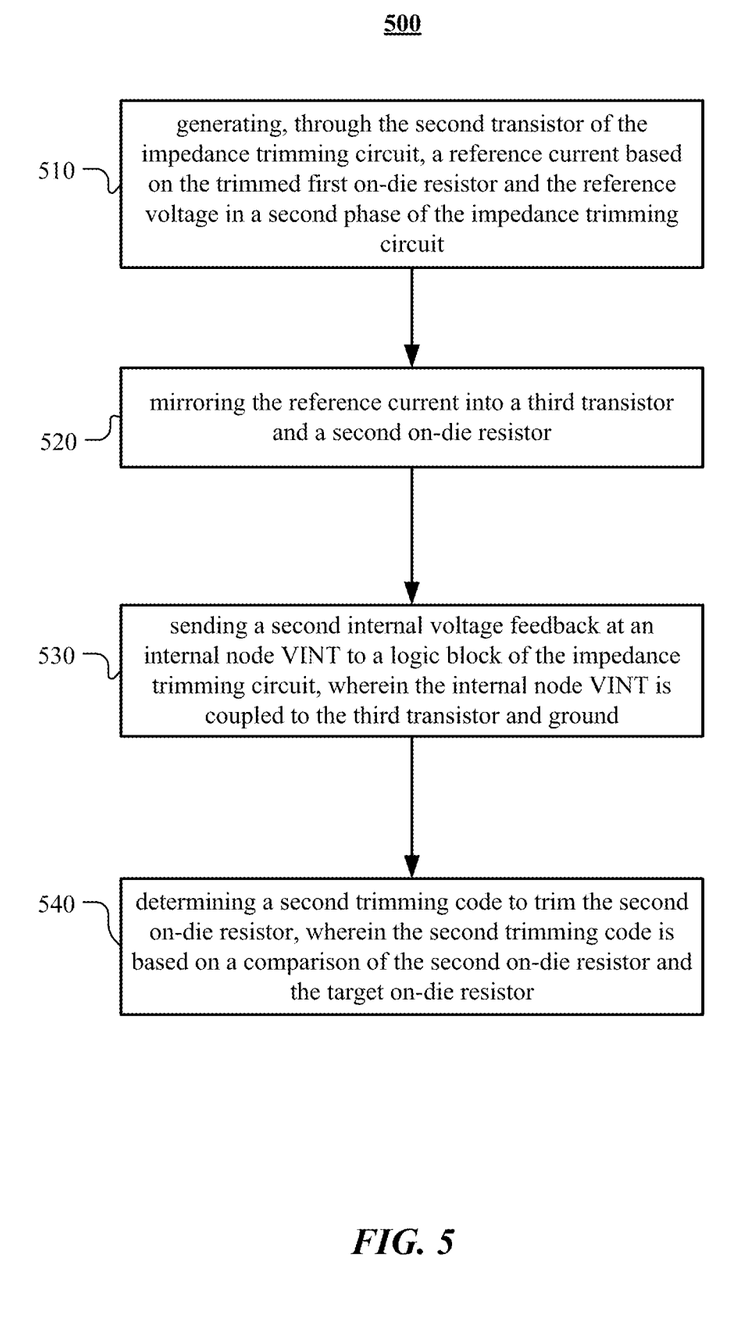
FIG. 5 illustrates an example method for termination impedance trimming at the production phase.

FIG. 5 illustrates an example method 500 for termination impedance trimming at the production phase. The method may begin at step 510, where the high-speed I/O impedance trimming circuit 120 may generate, through the second transistor of the impedance trimming circuit, a reference current based on the trimmed first on-die resistor and the reference voltage in a second phase of the impedance trimming circuit. At step 520, the high-speed I/O impedance trimming circuit 120 may mirror the reference current into a third transistor and a second on-die resistor. At step 530, the high-speed I/O impedance trimming circuit 120 may send a second internal voltage feedback at an internal node VINT to a logic block of the impedance trimming circuit, wherein the internal node VINT is coupled to the third transistor and ground. At step 540, the high-speed I/O impedance trimming circuit 120 may determining a second trimming code to trim the second on-die resistor, wherein the second trimming code is based on a comparison of the second on-die resistor and the target on-die resistor. Particular embodiments may repeat one or more steps of the method of FIG. 5, where appropriate. Although this disclosure describes and illustrates particular steps of the method of FIG. 5 as occurring in a particular order, this disclosure contemplates any suitable steps of the method of FIG. 5 occurring in any suitable order. Moreover, although this disclosure describes and illustrates an example method for termination impedance trimming at the production phase including the particular steps of the method of FIG. 5, this disclosure contemplates any suitable method for termination impedance trimming at the production phase including any suitable steps, which may include all, some, or none of the steps of the method of FIG. 5, where appropriate. Furthermore, although this disclosure describes and illustrates particular components, devices, or systems carrying out particular steps of the method of FIG. 5, this disclosure contemplates any suitable combination of any suitable components, devices, or systems carrying out any suitable steps of the method of FIG. 5.

Figure 6:
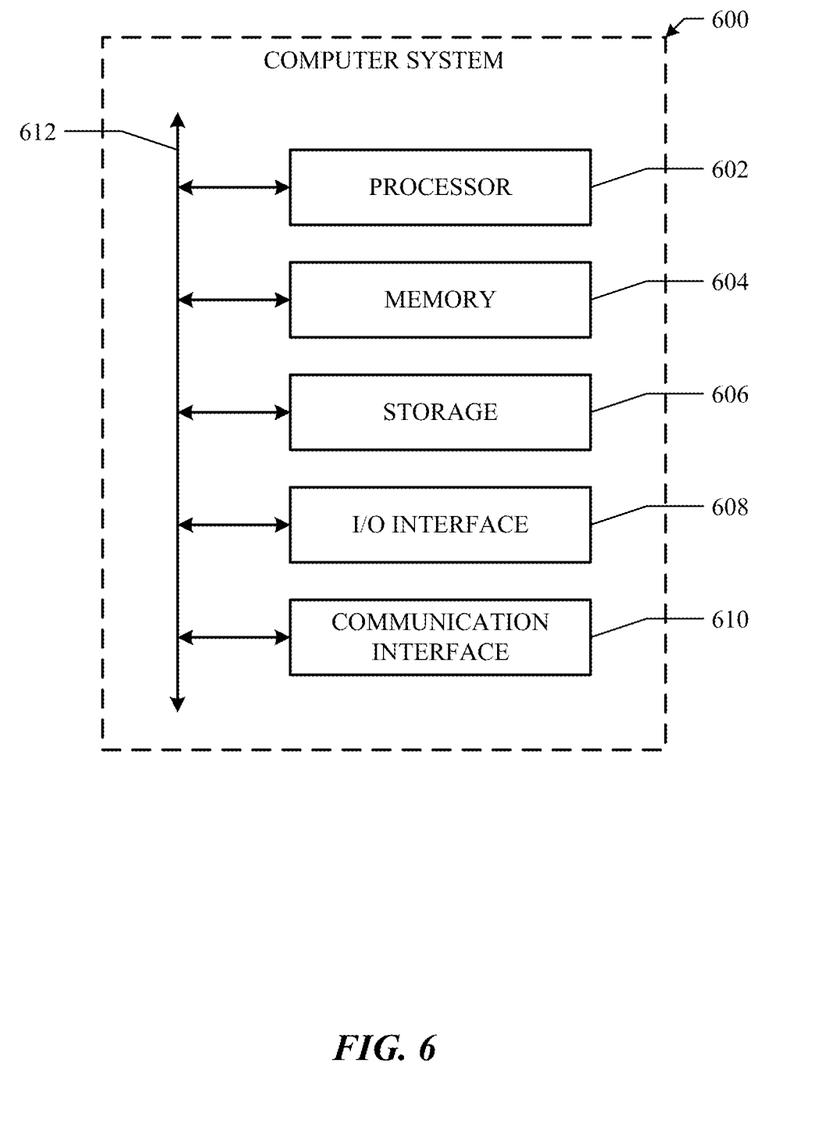
FIG. 6 illustrates an example computer system.

FIG. 6 illustrates an example computer system 600. In particular embodiments, one or more computer systems 600 perform one or more steps of one or more methods described or illustrated herein. In particular embodiments, one or more computer systems 600 provide functionality described or illustrated herein. In particular embodiments, software running on one or more computer systems 600 performs one or more steps of one or more methods described or illustrated herein or provides functionality described or illustrated herein. Particular embodiments include one or more portions of one or more computer systems 600. Herein, reference to a computer system may encompass a computing device, and vice versa, where appropriate. Moreover, reference to a computer system may encompass one or more computer systems, where appropriate.

This disclosure contemplates any suitable number of computer systems 600. This disclosure contemplates computer system 600 taking any suitable physical form. As example and not by way of limitation, computer system 600 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, or a combination of two or more of these. Where appropriate, computer system 600 may include one or more computer systems 600; be unitary or distributed; span multiple locations; span multiple machines; span multiple data centers; or reside in a cloud, which may include one or more cloud components in one or more networks. Where appropriate, one or more computer systems 600 may perform without substantial spatial or temporal limitation one or more steps of one or more methods described or illustrated herein. As an example and not by way of limitation, one or more computer systems 600 may perform in real time or in batch mode one or more steps of one or more methods described or illustrated herein. One or more computer systems 600 may perform at different times or at different locations one or more steps of one or more methods described or illustrated herein, where appropriate.

In particular embodiments, computer system 600 includes a processor 602, memory 604, storage 606, an input/output (I/O) interface 608, a communication interface 610, and a bus 612. Although this disclosure describes and illustrates a particular computer system having a particular number of particular components in a particular arrangement, this disclosure contemplates any suitable computer system having any suitable number of any suitable components in any suitable arrangement.

In particular embodiments, processor 602 includes hardware for executing instructions, such as those making up a computer program. As an example and not by way of limitation, to execute instructions, processor 602 may retrieve (or fetch) the instructions from an internal register, an internal cache, memory 604, or storage 606; decode and execute them; and then write one or more results to an internal register, an internal cache, memory 604, or storage 606. In particular embodiments, processor 602 may include one or more internal caches for data, instructions, or addresses. This disclosure contemplates processor 602 including any suitable number of any suitable internal caches, where appropriate. As an example and not by way of limitation, processor 602 may include one or more instruction caches, one or more data caches, and one or more translation lookaside buffers (TLBs). Instructions in the instruction caches may be copies of instructions in memory 604 or storage 606, and the instruction caches may speed up retrieval of those instructions by processor 602. Data in the data caches may be copies of data in memory 604 or storage 606 for instructions executing at processor 602 to operate on; the results of previous instructions executed at processor 602 for access by subsequent instructions executing at processor 602 or for writing to memory 604 or storage 606; or other suitable data. The data caches may speed up read or write operations by processor 602. The TLBs may speed up virtual-address translation for processor 602. In particular embodiments, processor 602 may include one or more internal registers for data, instructions, or addresses. This disclosure contemplates processor 602 including any suitable number of any suitable internal registers, where appropriate. Where appropriate, processor 602 may include one or more arithmetic logic units (ALUs); be a multi-core processor; or include one or more processors 602. Although this disclosure describes and illustrates a particular processor, this disclosure contemplates any suitable processor.

In particular embodiments, memory 604 includes main memory for storing instructions for processor 602 to execute or data for processor 602 to operate on. As an example and not by way of limitation, computer system 600 may load instructions from storage 606 or another source (such as, for example, another computer system 600) to memory 604. Processor 602 may then load the instructions from memory 604 to an internal register or internal cache. To execute the instructions, processor 602 may retrieve the instructions from the internal register or internal cache and decode them. During or after execution of the instructions, processor 602 may write one or more results (which may be intermediate or final results) to the internal register or internal cache. Processor 602 may then write one or more of those results to memory 604. In particular embodiments, processor 602 executes only instructions in one or more internal registers or internal caches or in memory 604 (as opposed to storage 606 or elsewhere) and operates only on data in one or more internal registers or internal caches or in memory 604 (as opposed to storage 606 or elsewhere). One or more memory buses (which may each include an address bus and a data bus) may couple processor 602 to memory 604. Bus 612 may include one or more memory buses, as described below. In particular embodiments, one or more memory management units (MMUs) reside between processor 602 and memory 604 and facilitate accesses to memory 604 requested by processor 602. In particular embodiments, memory 604 includes random access memory (RAM). This RAM may be volatile memory, where appropriate. Where appropriate, this RAM may be dynamic RAM (DRAM) or static RAM (SRAM). Moreover, where appropriate, this RAM may be single-ported or multi-ported RAM. This disclosure contemplates any suitable RAM. Memory 604 may include one or more memories 604, where appropriate. Although this disclosure describes and illustrates particular memory, this disclosure contemplates any suitable memory.

In particular embodiments, storage 606 includes mass storage for data or instructions. As an example and not by way of limitation, storage 606 may include a hard disk drive (HDD), a floppy disk drive, flash memory, an optical disc, a magneto-optical disc, magnetic tape, or a Universal Serial Bus (USB) drive or a combination of two or more of these. Storage 606 may include removable or non-removable (or fixed) media, where appropriate. Storage 606 may be internal or external to computer system 600, where appropriate. In particular embodiments, storage 606 is non-volatile, solid-state memory. In particular embodiments, storage 606 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 606 taking any suitable physical form. Storage 606 may include one or more storage control units facilitating communication between processor 602 and storage 606, where appropriate. Where appropriate, storage 606 may include one or more storages 606. Although this disclosure describes and illustrates particular storage, this disclosure contemplates any suitable storage.

In particular embodiments, I/O interface 608 includes hardware, software, or both, providing one or more interfaces for communication between computer system 600 and one or more I/O devices. Computer system 600 may include one or more of these I/O devices, where appropriate. One or more of these I/O devices may enable communication between a person and computer system 600. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 608 for them. Where appropriate, I/O interface 608 may include one or more device or software drivers enabling processor 602 to drive one or more of these I/O devices. I/O interface 608 may include one or more I/O interfaces 608, where appropriate. Although this disclosure describes and illustrates a particular I/O interface, this disclosure contemplates any suitable I/O interface.

In particular embodiments, communication interface 610 includes hardware, software, or both providing one or more interfaces for communication (such as, for example, packet-based communication) between computer system 600 and one or more other computer systems 600 or one or more networks. As an example and not by way of limitation, communication interface 610 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 610 for it. As an example and not by way of limitation, computer system 600 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 600 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. Computer system 600 may include any suitable communication interface 610 for any of these networks, where appropriate. Communication interface 610 may include one or more communication interfaces 610, where appropriate. Although this disclosure describes and illustrates a particular communication interface, this disclosure contemplates any suitable communication interface.

In particular embodiments, bus 612 includes hardware, software, or both coupling components of computer system 600 to each other. As an example and not by way of limitation, bus 612 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 612 may include one or more buses 612, where appropriate. Although this disclosure describes and illustrates a particular bus, this disclosure contemplates any suitable bus or interconnect.

Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

What is claimed is:

1. A high-speed input/output (I/O) interface impedance trimming method comprising the steps of:
   generating, through a first transistor of an impedance trimming circuit, a precision current based on a reference voltage and an automatic test equipment (ATE) in a first phase of the impedance trimming circuit, wherein the ATE is coupled to the impedance trimming circuit to receive the precision current;
   mirroring the precision current into a second transistor and a first programmable component capable of providing variable resistance;
   sending a first internal voltage feedback at a first internal node to the ATE, wherein the first internal node is coupled to the second transistor and the first programmable component, wherein the first internal voltage feedback is associated with the mirrored precision current and a current resistance value of the programmable component; and
   receiving a first instruction from the ATE for adjusting the first programmable component to provide an adjusted resistance value, wherein the first instruction is based on a comparison of the current resistance value of the first programmable component, computed based on the precision current and the first internal voltage feedback, and a target resistance value.

2. The method of claim 1, wherein the ATE comprises a circuit that is configured to mimic an external precision resistor.

3. The method of claim 1, wherein the mirrored precision current is scalable.

4. The method of claim 1, wherein the first instruction is stored in a shadow register of the impedance trimming circuit.

5. The method of claim 1, wherein the impedance trimming circuit communicates with the ATE through a communication channel.

6. The method of claim 1, further comprising:
   generating, through the second transistor of the impedance trimming circuit, a reference current based on the adjusted first programmable component and the reference voltage in a second phase of the impedance trimming circuit;
   mirroring the reference current into a third transistor and a second programmable component capable of providing variable resistance;
   sending a second internal voltage feedback at a second internal node to a logic block of the impedance trimming circuit, wherein the second internal node is coupled to the third transistor and the second programmable component, wherein the second internal voltage feedback is associated with the mirrored reference current and a current resistance value of the second programmable component; and
   determining a second instruction for adjusting the second programmable component, wherein the second instruction is based on a comparison of the current resistance value of the second programmable component, computed based on the reference current and the second internal voltage feedback, and the target resistance value.

7. The method of claim 6, wherein the second programmable component comprises device resistors and termination resistors.

8. A high-speed input/output (I/O) interface impedance trimming circuit comprising:
   a first transistor coupled to an amplifier to form a first loop configured to generate a precision current based on a reference voltage and an automatic test equipment (ATE) in a first phase of the impedance trimming circuit, wherein the ATE is coupled to the impedance trimming circuit to receive the precision current;
   a second transistor coupled to a first programmable component capable of providing variable resistance configured to receive a mirrored precision current;
   a first internal node coupled to the second transistor and the first programmable component, wherein the first internal node is configured to provide a first internal voltage feedback through an analog-to-digital converter (ADC) coupled to the first internal node;
   a shadow register coupled to the first programmable component to receive a first instruction from the ATE for adjusting the programmable component to provide an adjusted resistance value, wherein the first instruction is based on a comparison of the current resistance value of the programmable component, computed based on the precision current and the first internal voltage feedback, and a target resistance value.

9. The impedance trimming circuit of claim 8, further comprising:
   the second transistor coupled to the amplifier to form a second loop configured to generate a reference current based on the adjusted first programmable component and the reference voltage in a second phase of the impedance trimming circuit;
   a third transistor coupled to a second programmable component configured to receive a mirrored reference current; and
   a second internal node coupled to the third transistor and the second programmable component, wherein the second internal node is configured to provide a second internal voltage feedback through a logic block coupled to the ADC, wherein the second internal voltage feedback is associated with the mirrored reference current and a current resistance value of the second programmable component, wherein the logic block is configured to determine a second instruction for adjusting the second programmable component, wherein the second instruction is based on a comparison of the current resistance value of the second programmable component, computed based on the reference current and the second internal voltage feedback and the target resistance value.

10. The impedance trimming circuit of claim 8, further comprising an electrostatic discharge (ESD) circuit to improve an accuracy of the first internal voltage feedback.

11. The impedance trimming circuit of claim 8, wherein the ATE comprises a circuit that is configured to mimic an external precision resistor.

12. The impedance trimming circuit of claim 8, wherein the mirrored precision current is scalable.

13. The impedance trimming circuit of claim 8, wherein the impedance trimming circuit communicates with the ATE through a communication channel.

14. A system comprising:
an impedance trimming circuit configured to:
generate, through a first transistor of an impedance trimming circuit, a precision current in a first phase of the impedance trimming circuit;
mirror the precision current into a second transistor and a first programmable component capable of providing variable resistance;
send a first internal voltage feedback at a first internal node, wherein the first internal node is coupled to the second transistor and the first programmable component, wherein the first internal voltage feedback is associated with the mirrored precision current and a current resistance value of the programmable component; and
receive a first instruction from the ATE for adjusting the first programmable component to provide an adjusted resistance value, wherein the first instruction is based on a comparison of the current resistance value of the first programmable component, computed based on the precision current and the first internal voltage feedback, and a target resistance value; and
an automatic test equipment (ATE) coupled to the impedance trimming circuit to receive the precision current, wherein the precision current based on a reference voltage and an ATE, wherein the first internal voltage feedback is sent to ATE, wherein the ATE determines the first instruction based on the comparison of the current resistance value of the first programmable component and a target resistance value.

15. The system of claim 14, wherein the ATE comprises a circuit that is configured to mimic an external precision resistor.

16. The system of claim 14, wherein the mirrored precision current is scalable.

17. The system of claim 14, wherein the first trimming code is stored in a shadow register of the impedance trimming circuit.

18. The system of claim 14, wherein the impedance trimming circuit communicates with the ATE through a communication channel.

19. The system of claim 14, wherein the impedance trimming circuit is further configured to:
generating, through the second transistor of the impedance trimming circuit, a reference current based on the adjusted first programmable component and the reference voltage in a second phase of the impedance trimming circuit;
mirror the reference current into a third transistor and a second programmable component capable of providing variable resistance;
sending a second internal voltage feedback at a second internal node to a logic block of the impedance trimming circuit, wherein the second internal node is coupled to the third transistor and the second programmable component, wherein the second internal voltage feedback is associated with the mirrored reference current and a current resistance value of the second programmable component; and
determining a second instruction for adjusting the second programmable component, wherein the second instruction is based on a comparison of the current resistance value of the second programmable component, computed based on the reference current and the second internal voltage feedback, and the target resistance value.

20. The method of claim 19, wherein the second programmable component comprises device resistors and termination resistors.

* * * * *